United States Patent [19]

Higgins, III

[11] Patent Number: 5,212,402
[45] Date of Patent: May 18, 1993

[54] SEMICONDUCTOR DEVICE WITH INTEGRAL DECOUPLING CAPACITOR

[75] Inventor: Leo M. Higgins, III, Austin, Tex.

[73] Assignee: Motorola, Inc., Schaumburg, Ill.

[21] Appl. No.: 834,929

[22] Filed: Feb. 14, 1992

[51] Int. Cl.$^5$ .................... H01L 23/48; H01L 21/60; H01G 1/14

[52] U.S. Cl. .................... 257/532; 257/672; 257/700; 361/306; 437/206; 437/211; 437/919

[58] Field of Search ............ 257/532, 672, 700; 361/306; 437/206, 211, 919

[56] References Cited

U.S. PATENT DOCUMENTS 4,903,113 2/1990 Frankeny et al. .................... 357/70
4,994,936 2/1991 Hernandez .................... 257/532

*Primary Examiner*—Edward Wojciechowicz
*Attorney, Agent, or Firm*—Patricia S. Goddard

[57] ABSTRACT

A semiconductor device (10) has a decoupling capacitor (55) which is formed of a ground paddle (37), a dielectric element (57), and a power paddle (23). The power paddle is formed as a conductive element of a first TAB leadframe (12) and is contiguous with power leads (19). The first TAB leadframe also includes signal leads (16). The ground paddle is formed as a conductive element of a second TAB leadframe (14) and is contiguous with ground leads (36). The two leadframes are superimposed with one another to form the decoupling capacitor and to intersperse the ground leads with the power and signal leads. In one embodiment of the invention, power paddle (23) is raised above the leads to accommodate the dielectric element. The invention permits all power and all ground leads to be electrically coupled to the decoupling capacitor while keeping the decoupling capacitor very close to a semiconductor die (38).

17 Claims, 7 Drawing Sheets

SEMICONDUCTOR DEVICE WITH INTEGRAL DECOUPLING CAPACITOR

CROSS-REFERENCE TO RELATED APPLICATION

The present application is related to a commonly assigned, co-pending application by Leo M. Higgins III entitled, "TAPE AUTOMATED BONDING (TAB) SEMICONDUCTOR DEVICE WITH GROUND PLANE AND METHOD FOR MAKING THE SAME," Ser. No. 07/834,964, filed Feb. 14, 1992.

FIELD OF THE INVENTION

The present invention relates to semiconductor devices in general, and more specifically to semiconductor devices having decoupling capacitors and methods for making such devices.

BACKGROUND OF THE INVENTION

A continuing object of high performance semiconductor manufacturers is to increase power and speed of a semiconductor device while keeping device size to a minimum. However by increasing device and system density to reduce size, electrical performance of the device is often adversely affected. For instance, inductance of an integrated circuit and a device package can induce spurious voltage spikes in a power supply system which can in turn couple to signal leads of the device and cause timing problems in signal switching.

A common method of negating the effects of inductance and rapid voltage changes in a device is to use a decoupling capacitor. Decoupling capacitors shunt power and ground planes or power and ground leads so that rapid voltage changes in the device result in an electrical short circuit across the capacitor, translating voltage spikes into a stored charge on the decoupling capacitor. The stored charge either dissipates or is used as a local power supply to device inputs during subsequent signal switching stages, allowing the decoupling capacitor to negate the effects of voltage noise induced into the system by parasitic inductance.

One way in which decoupling capacitors have been used in the past is by mounting a discrete decoupling capacitor next to a semiconductor device on a substrate, such as a PC board. Conductive traces on the substrate are used to electrically couple the decoupling capacitor to power and ground pins of the semiconductor device. Another approach is to attach a discrete decoupling capacitor directly to the face of a semiconductor die such that the decoupling capacitor is electrically coupled to power and ground bond pads of the die or to power and ground leads. Yet another technique is to electrically couple a discrete decoupling capacitor to adjacent power and ground leads of a tape automated bonding (TAB) device.

Each of the known methods of using decoupling capacitors mentioned above serves to negate the effects of rapid voltage swings in a semiconductor device to a degree. However, a disadvantage of some known decoupling capacitors is that the capacitors require additional area on a substrate or increase the size of a semiconductor device. Therefore, many of the decoupling capacitors currently in use go against a primary objective of semiconductor manufacturers and users to reduce device size and area. Another disadvantage with some known decoupling capacitors is that an undesirable amount of inductance is associated with the interconnection between the semiconductor die and the decoupling capacitor. For this reason, it is desirable to have a decoupling capacitor which is as close to the die as possible in order to shorten the interconnection distance, thereby lowering inductance. An additional disadvantage with some known methods of employing a decoupling capacitor is that not all power and ground leads are electrically coupled to the capacitor. Therefore, rapid voltage swings in a device are not countered fast enough or are not countered as effectively as desired.

SUMMARY OF THE INVENTION

Many of the problems associated with existing semiconductor devices are overcome by the present invention. In one form, a semiconductor device in accordance with the invention includes a semiconductor die having a plurality of first voltage bond pads and a plurality of second voltage bond pads. A first leadframe of the device has a first voltage plane and a plurality of first voltage leads which are contiguous with the first voltage plane. The first voltage leads are electrically coupled to the plurality of first voltage bond pads of the semiconductor die. A second leadframe of the device has a second voltage plane and a plurality of second voltage leads which are contiguous with the second voltage plane. The second voltage leads are electrically coupled to the plurality of second voltage bond pads of the semiconductor die. The second leadframe is superimposed with the first leadframe such that the second voltage plane overlies the first voltage plane, such that both the first and second voltage planes overlies the semiconductor die, and such that the first and second leadframes are electrically isolated from one another. A dielectric element separated the first and second voltage planes to form a decoupling capacitor over the semiconductor die.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

The present invention provides a decoupling capacitor which is integral to leadframes of a semiconductor device, preferably tape automated bonding (TAB) leadframes. The decoupling capacitor is located very close to a semiconductor die and is electrically coupled to all power and ground leads of the semiconductor device. In one embodiment of the invention, two leadframes are superimposed with one another. One of the leadframes includes a ground plane and ground leads, while the other leadframe includes a power plane, power leads, and signal leads. A dielectric element, for example in the form of a dielectric polymer or ceramic or a preformed capacitor, is placed on one of the two planes. Upon superimposing the two leadframes, a decoupling capacitor is formed by the power plane, ground plane, and dielectric element. The superimposed leadframes are aligned to the semiconductor die such that the decoupling capacitor overlies the die and the leads are aligned with appropriate bond pads for inner lead bonding (ILB). Since the power plane is contiguous with each of the power leads and the ground plane is contiguous with each of the ground leads, all power supply system leads are electrically coupled to the decoupling capacitor for improved decoupling.

Figure 1:
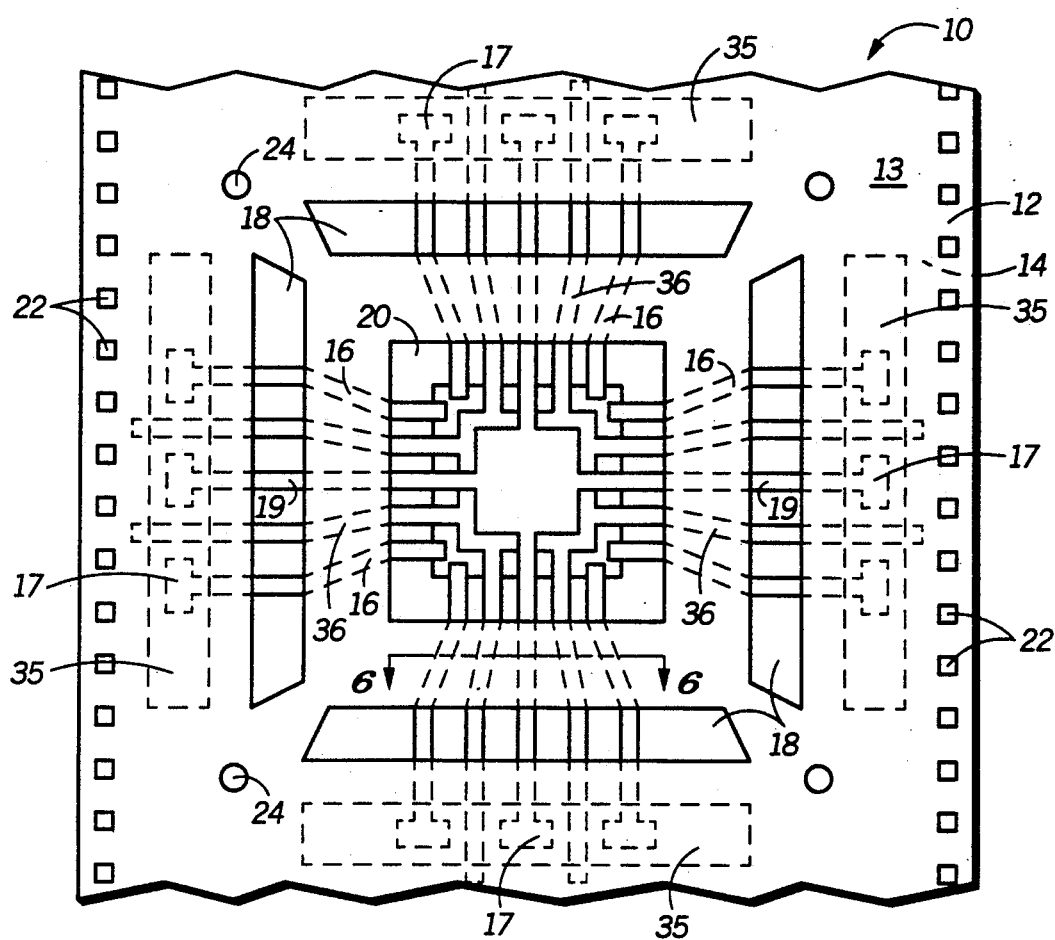
FIG. 1 is a plan view of a TAB semiconductor device in accordance with the present invention.

Specific details of the present invention will become more clearly understood in reference to the accompanying drawings. Illustrated in FIG. 1 is a plan view of a semiconductor device 10 in accordance with the present invention. Device 10 includes a first tape automated bonding (TAB) leadframe 12 superimposed with a second TAB leadframe 14. As illustrated, first TAB leadframe 12 is positioned on top of second TAB leadframe 14. The first and second TAB leadframes are also illustrated individually in FIG. 2 and FIG. 3 respectively. While the remainder of this discussion is directed to the use of two TAB leadframes or tapes, one skilled in the art will appreciate that the present invention may also be practiced with metal leadframes and the like.

Figure 2:
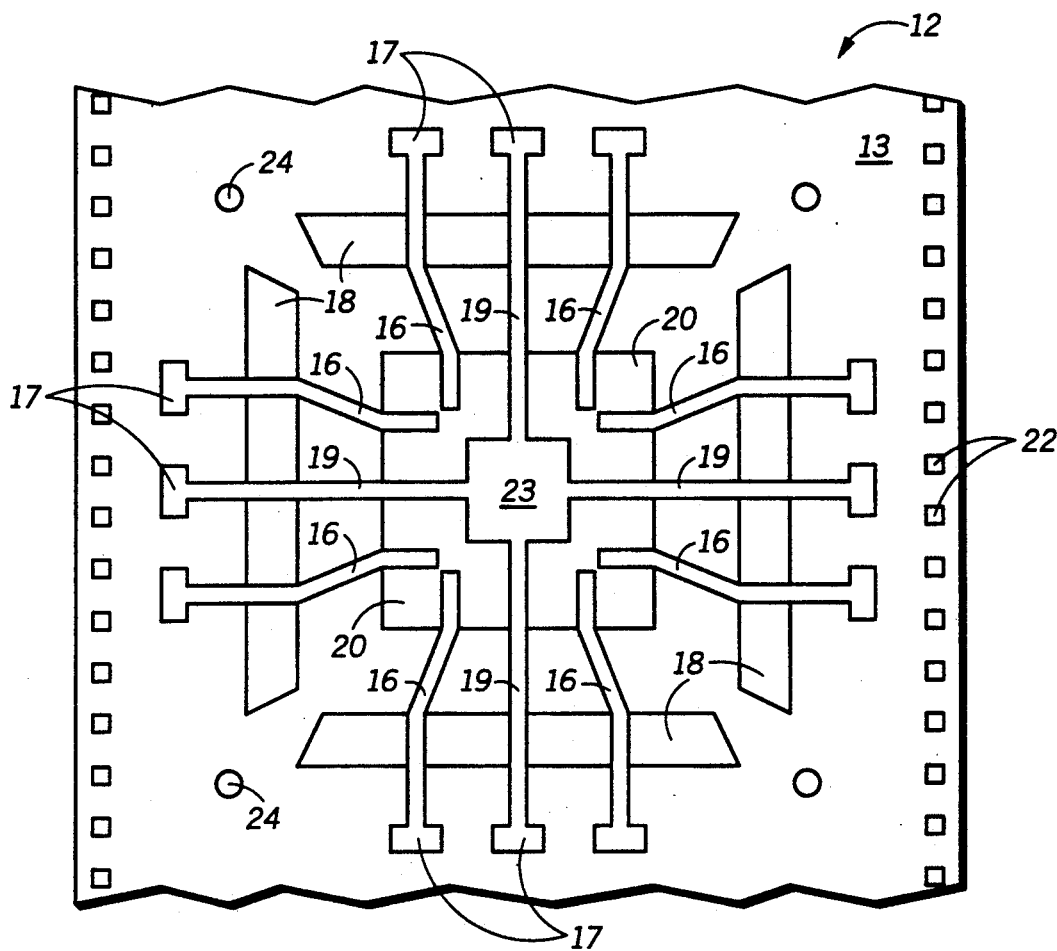
FIG. 2 is a plan view of a first TAB leadframe included in the device of FIG. 1. The first TAB leadframe forms a plurality of power and signal leads.

First TAB leadframe 12, as illustrated in FIG. 2, is formed of an insulative carrier tape 13. Carrier tape 13 is preferably a polymer material, such as a polyimide used in conventional TAB tape structures. A plurality of signal leads or traces 16 are formed on a front surface or face of carrier tape 13. In FIG. 2, the front surface of carrier tape 13 is displayed, while in FIG. 1 an opposing back surface of carrier tape 13 is displayed (thus the need for partial hidden lines indicating leads beneath the carrier tape). Not all signal leads are labelled in FIG. 1 for purposes of clarity, but each are labelled in FIG. 2. Signal leads 16 are generally made of copper, gold-plated copper, solder-plated copper, or tin-plated copper, and are formed on carrier tape 13 by conventional lithography and etching methods or by additive plating.

At the outer end of each signal lead 16 is a test pad 17. The test pads are generally formed at the same time as the signal leads during leadframe manufacture and are most often of the same material. Test pads 17 are used as contact sites during functional testing of the device, prior to excising the device from the leadframe.

As illustrated in both FIGS. 1 and 2, first TAB leadframe 12 also includes a plurality of power leads 19. Although power leads 19 are illustrated as being in alternating lead positions with signal leads 16, this is not a requirement of the invention. Lead configuration will vary depending on circuitry layout of a semiconductor die (not shown). Test pads 17 are also present at outer lead portions of power leads 19 and signal leads 16 in order to permit functional testing of the device. Inner lead portions of the power leads extend inward to form a power plane or paddle 23. Power paddle 23 is contiguous with each of the power leads and can be formed as part of leadframe 12 at the same time in which the signal and power leads are formed. The power paddle is preferably made as large as possible without interfering with other leads of the device, such as signal leads 16 or ground leads 36. In one embodiment of the invention, power paddle 23 is raised in comparison to the signal and power leads by, for example, stamping, as will be explained below.

Also included in first TAB leadframe 12 are outer lead bonding (OLB) openings 18 and an inner lead bonding opening (ILB) 20 which are each formed in carrier tape 13 and are similar to those of known TAB tape structures. Sprocket holes 22 and alignment holes 24 are also provided in the carrier tape. Alignment holes 24 are used to properly align first TAB leadframe 12 in manufacturing equipment, while sprocket holes 22 are used to index the leadframe from one position to another within the equipment. Each of the holes and openings in carrier tape 14 are formed using known processes. The holes and openings in the carrier tape may be formed before or after conductive elements of the leadframe are formed.

Figure 7:
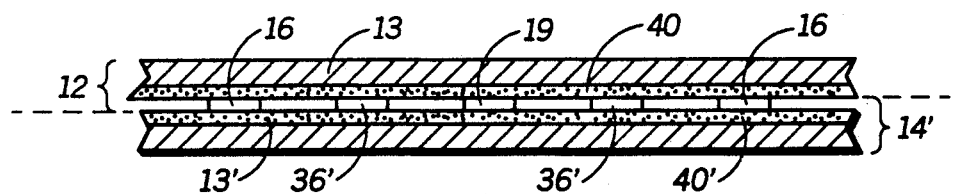
FIG. 7 is a cross-sectional view of an alternative TAB leadframe which is suited for use in another embodiment of the present invention, as would be viewed along line 6—6 of FIG. 1.
Figure 3:
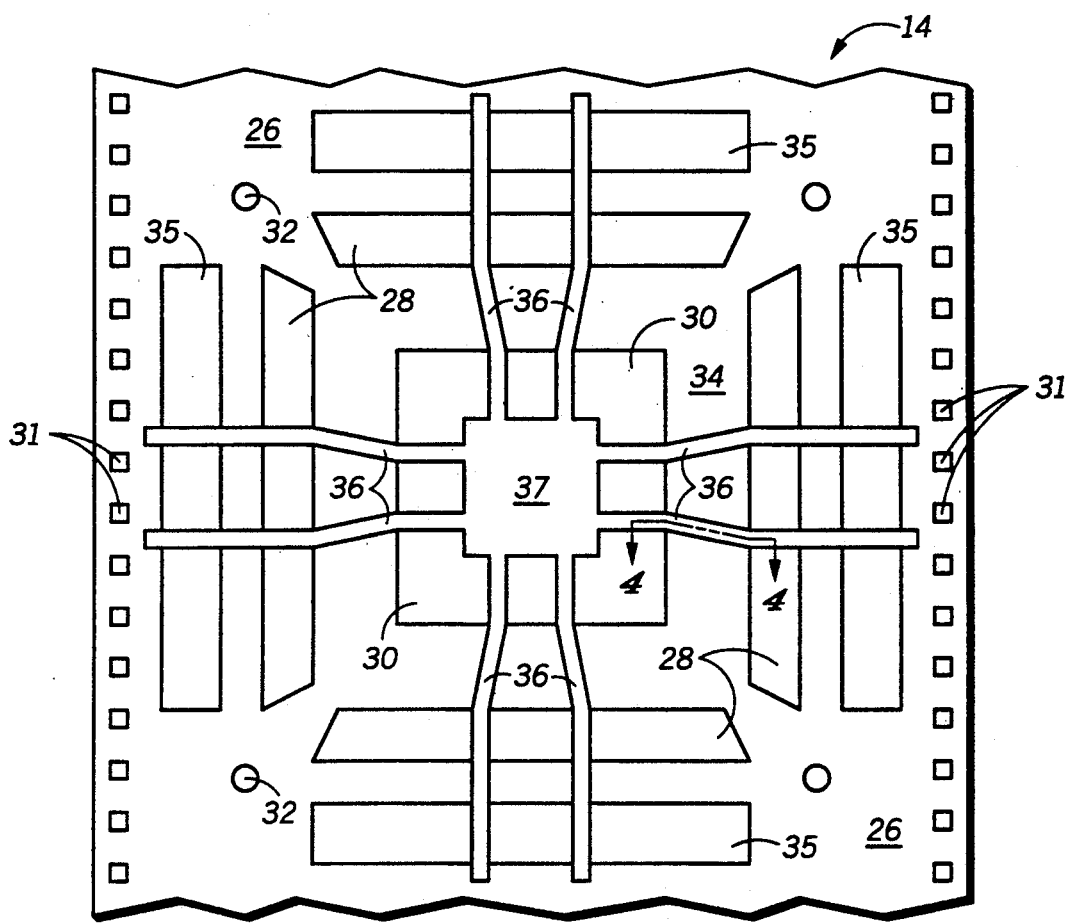
FIG. 3 is a plan view of a second TAB leadframe included in the device of FIG. 1. The second TAB leadframe forms a plurality of ground leads.

In one embodiment of the present invention, second TAB leadframe 14, illustrated in FIG. 3, is formed of a conductive thin film or foil 26, which is preferably a copper foil. Rather than being formed of a conductive foil, leadframe 14 may be formed of a polymer carrier tape (not shown) similar to carrier tape 13 of leadframe 12, as will be described in reference to FIG. 7. Referring to FIG. 3, outer lead bond (OLB) openings 28 and an inner lead bond (ILB) opening 30 are formed in conductive foil 26. Also provided in leadframe 14 are test pad openings 35, which as indicated in FIG. 1 are located to permit access to test pads 17. Each of the ILB, OLB, and test pad openings, along with sprocket holes 31 and alignment holes 32, are formed in leadframe 14 by conventional punching or etching process. Bounded by OLB openings 28 is an annular ground plane 34 which encircles ILB opening 30. Ground plane 34 is formed as part of conductive foil 26. A plurality of ground leads 36 are included on a front face of leadframe 14. Ground leads 36 are embossed on a surface of ground plane 34 such that the ground leads and ground plane form one continuous structure, as will be described further in reference to FIG. 4 and FIG. 5. As drawn in FIG. 3, ground leads 36 are formed above ground plane 34, or in other words are raised in a perpendicular direction toward the reader. As ground leads 36 extend into ILB opening 30, a ground plane or ground paddle 37 is formed. Ground plane 37 is contiguous with each of the ground leads and can be formed as part of leadframe 14 at the same time in which ground leads 36 and annular ground plane 34 are formed. The ground paddle is preferably made as large as possible without interfering with other leads of the device.

Figure 4:
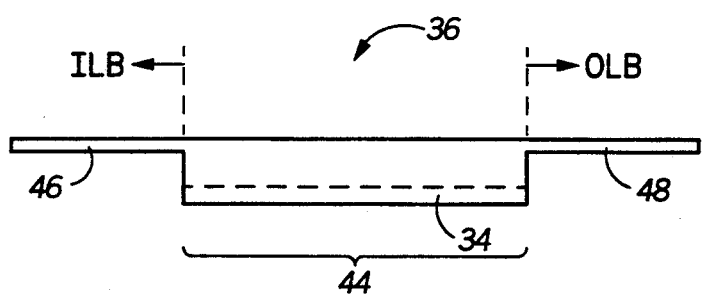
FIG. 4 is a partial cross-sectional view of a ground lead taken along the line 4—4 of FIG. 3.

FIG. 4 illustrates, in a partial cross-sectional view, one of the ground leads of FIG. 3 taken along the line 4—4. Ground lead 36 has a central portion 44, the bottom surface of which is part of annular ground plane 34. Central portion 44 is embossed with respect to ground plane 34. Extending from the central portion 44 are an inner lead bonding (ILB) portion 46 and an outer lead bonding (OLB) portion 48. Referring to both FIG. 3 and FIG. 4, ILB portion 46 is that portion of ground lead 36 which extends into ILB opening 30 of leadframe 14. Similarly, OLB portion 48 is that portion of the lead which extends across OLB openings 28. The ILB and OLB portions of ground lead 36 are each shaped like a cantilever or ledge extending from central portion 44 in order to facilitate bonding operations. The ILB portion of each ground lead extends into ILB opening 30 until joining with ground paddle 37 (not shown in FIG. 4). Thicknesses of the ILB portion and the OLB portion of the ground lead and of ground paddle 37 should be similar to or equal to the thickness of the signal and power leads of the device so that all leads have a uniform thickness for bonding purposes, and lie substantially in a common plane in areas which are to be bonded to a die or substrate. Power paddle 23 may also be of a similar thickness. Suitable thicknesses for signal leads 16, power leads 19, ILB portion 46, and OLB portion 48 are on the order of 35-40 μm, if utilizing a standard one ounce copper TAB tape. The embossed central portions of the ground leads, on the other hand, are roughly 100 μm thick, 35-40 μm of which form annular ground plane 34.

Figure 5:
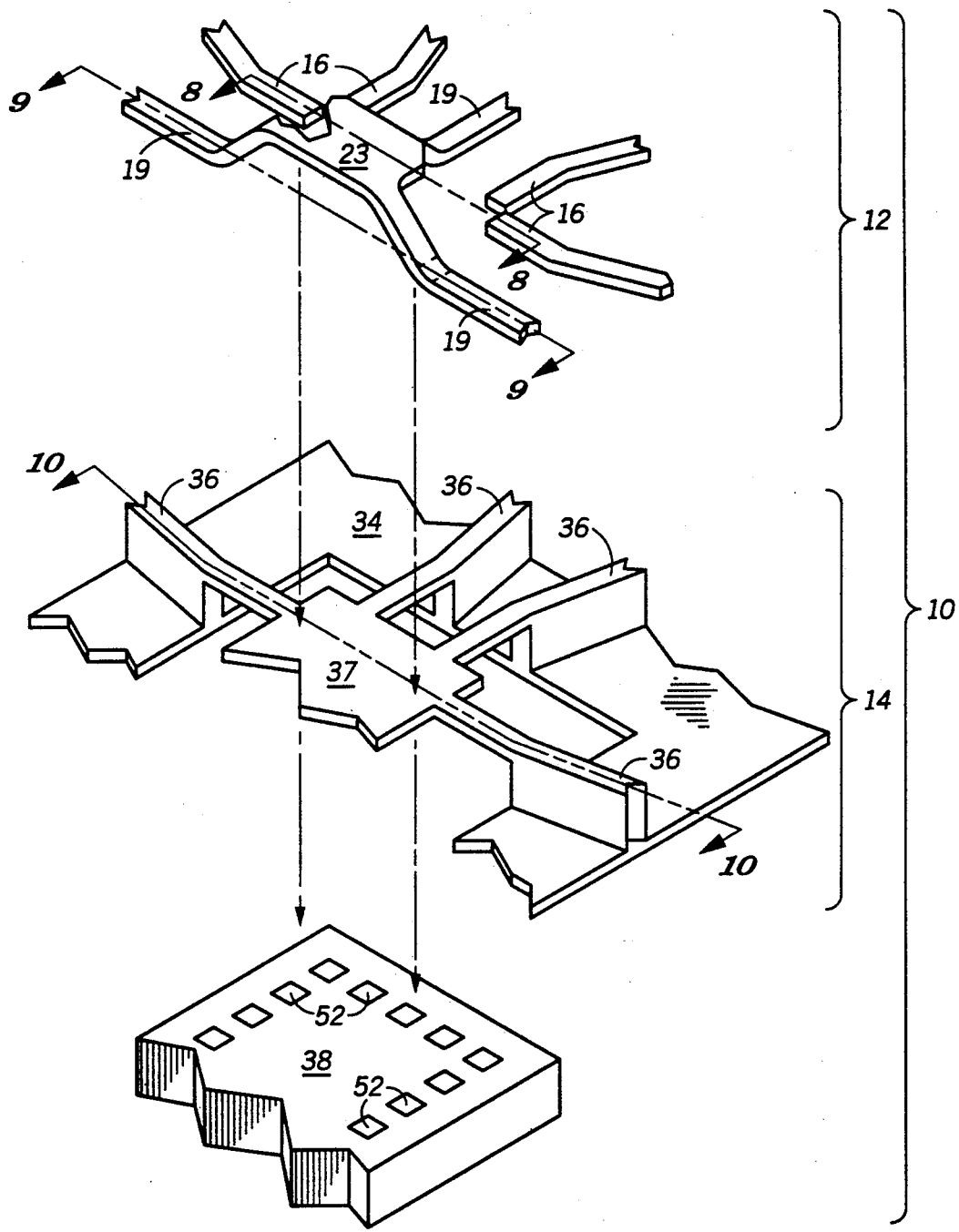
FIG. 5 is a three-dimensional view of portions of the first and second leadframes of FIGS. 2 and 3 illustrating how the leadframes are superimposed with respect to a semiconductor die in accordance with the present invention.

Referring again to FIG. 1, first TAB leadframe 12 and second TAB leadframe 14 are formed separately and are superimposed with one another, preferably in a face-to-face or front-to-front relationship, such that ground leads 36 are interspersed with signal leads 16 and power leads 19 and such that the two leadframes are electrically isolated from one another. The first and second TAB leadframes can be properly positioned with respect to one another by aligning the alignment holes of both leadframes. Upon positioning and bonding the two leadframes together, the leadframes can be handled as one composite unit. An advantage of the composite structure illustrated in FIG. 1 is that leads are less likely to be electrically short-circuited by particles such as dust. Due to the face-to-face relationship of the leadframes, the only portions of the leads which are exposed to the environment are those portions exposed through ILB opening 20 and OLB openings 18 (i.e. those portions not illustrated as hidden in FIG. 1). Another advantage of the composite nature of device 10 is that leadframes 12 and 14 are manufactured individually, such that the yield of one leadframe does not impact the yield of the other. Therefore, the overall yield of the composite leadframe structure is independent of the yields of the individual leadframes. A three-dimensional, cut-away view of how portions of leadframes 12 and 14 may be superimposed is illustrated in FIG. 5.

Figure 6:
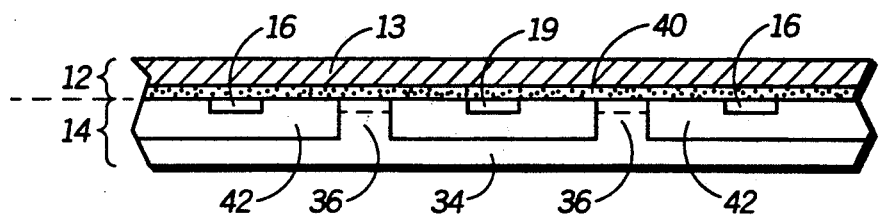
FIG. 6 is a cross-sectional view of the device of FIG. 1 taken along the line 6—6.

A portion of device 10 taken along the line 6—6 of FIG. 1 is illustrated in cross-section in FIG. 6. As illustrated, first leadframe 12 is positioned over second leadframe 14 such that signal leads 16 and power leads 19 of the first leadframe are interspersed with ground leads 36 of the second leadframe. Although it is illustrated that the leads of leadframe 12 and the leads of leadframe 14 have alternating locations (i.e. one lead from one leadframe is positioned between two adjacent leads of the other leadframe), such lead order is not necessary in practicing the present invention. Furthermore, the number of leads illustrated is merely representative and in no way limits the invention. In addition to the two groups of leads being interspersed, the ends of signal leads 16, power leads 19, and inner and outer portions of ground leads 36 are co-planar to facilitate ILB and OLB of the leads to a semiconductor die or substrate. Inner and outer lead portions of ground leads 36 are represented in FIG. 6 as dotted lines which are co-planar with the other leads.

First leadframe 12 as illustrated in FIG. 6 includes polymer carrier tape 13. Preferably an adhesive material 40 is formed on a surface of carrier tape 13 in order to mechanically support and adhesively bond signal leads 16 to the carrier tape. Adhesive material 40 is initially formed on carrier tape 13, and copper which is used to form signal leads 16 is bonded to the tape by the adhesive material. The copper is then patterned to form the leads. Upon aligning first leadframe 12 to second leadframe 14, portions of adhesive material 40 are brought in contact with ground leads 36. The adhesive material can be used to bond the ground leads of second leadframe 14 to first leadframe 12, thereby bonding the two leadframes together. If adhesive material 40 is a thermosetting material or is not able to be activated to adhere to ground leads 36, an additional adhesive material (not shown) may be applied to one of the two leadframes. Specifically, an additional adhesive material could be bonded to an upper surface of each ground lead 36. Adhesive coated polymers are commonly used by TAB tape manufacturers to improve adhesion between the polymer tape and conductive leads. Examples of adhesive materials used include polyimides, epoxies, acrylics, variants of these materials, and the like. Such adhesive materials, including thermosets and thermoplastics, are also suited for use in the present invention.

As indicated in FIG. 6, ground leads 36 are embossed on ground plane 34 so that the ground leads and ground plane form one monolithic structure. A method by which ground leads 36 and ground plane 34 can be formed is described subsequently with reference to FIGS. 11-16. In one embodiment of the present invention, ground leads 36 and signal leads 16 are separated from one another by air-gaps 42. The air-gaps are inherent to the device since the ground leads extend above the ground plane. The presence of air-gaps between the ground and signal leads serves to minimize cross-talk between the leads since air has a very low dielectric constant ($\epsilon_r$,air=1). The low $\epsilon_r$ of air provides low capacitive loading on signal leads 16, thereby reducing power consumption and propagation delay of the device. As an alternative to air, an insulating adhesive material having a dielectric constant on the order of 3.5 or less can be incorporated onto one of the leadframes so that air-gaps 42 would be filled with the low-dielectric adhesive material rather than being filled with air.

As an alternative to using a TAB leadframe which includes an annular ground plane having embossed ground leads, a more conventional TAB leadframe may be used. Such an alternative embodiment is illustrated in cross-section in FIG. 7. A TAB leadframe 14' is superimposed with TAB leadframe 12. Leadframe 14' differs from leadframe 14 of FIG. 6 in that an annular ground plane is not included and that ground leads 36' are shaped in a conventional manner similar to signal leads 16 and power leads 19. Leadframe 14' also includes a carrier tape 13' and an adhesive material 40' similar to those of leadframe 12 described earlier. In accordance with the present invention, leadframe 14' also includes a ground paddle (not shown in FIG. 7) similar to ground paddle 37 illustrated in FIG. 3.

After forming one composite leadframe structure by superimposing two TAB leadframes, inner portions of signal leads 16, power leads 19, and ground leads 36 are electrically coupled to bond pads 52 of a semiconductor die 38 (not shown in FIG. 1, refer to FIG. 5) during a process known as inner lead bonding (ILB). All leads may be individually or simultaneously bonded to the die using a commercially available thermocompression bonding tooling. Due to the presence of ground paddle 37 and power paddle 23, a bond tool which only compresses those portions of the leads to be bonded to the die should be used. In other words, a bond tool which also compresses the regions containing the power and ground paddles should be avoided. Following ILB, device 10 is manufactured in a tradition manner. Manufacturing steps used to complete device 10 may include: encapsulation of die 38, decoupling capacitor 55, and ILB portions of the leads; electrical test and burn-in of the device; and outer lead bonding (OLB) of the leads to a substrate, such as a printed circuit board or another leadframe.

Figure 8:
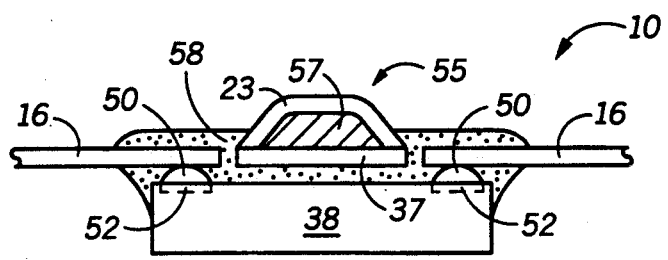
FIG. 8 is a cross-sectional view along the line 8—8 of FIG. 5 illustrating two signal leads as coupled to the semiconductor die.
Figure 9:
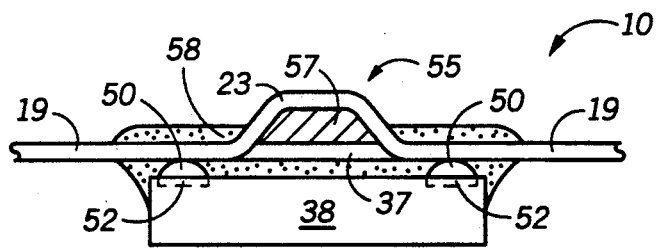
FIG. 9 is a cross-sectional view along the line 9—9 of FIG. 5 illustrating two power leads as coupled to the semiconductor die.
Figure 10:
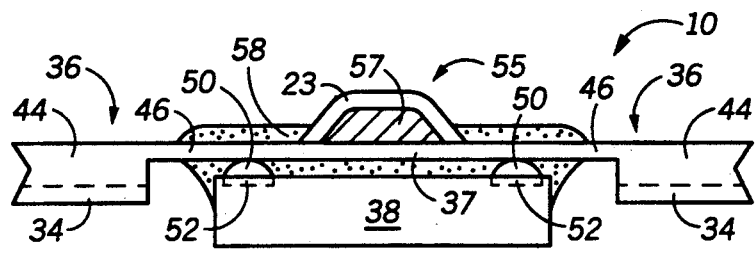
FIG. 10 is a cross-sectional view along the line 10—10 of FIG. 5 illustrating two ground leads as coupled to the semiconductor die.

FIGS. 8–10 illustrate various cross-sections of device 10. FIG. 8 illustrates a cross-section through signal leads 16 taken along the line 8—8 of FIG. 5, as the leads would be bonded to semiconductor die 38. Each of the leads are bonded to the die using known techniques. Typically a metallurgical bump 50 is formed on a bond pad 52 of the die. The leads are bonded individually or simultaneously to the bumps by thermocompression bonding. Also illustrated in FIG. 8 is a decoupling capacitor 55 which overlies the semiconductor die. Decoupling capacitor 55 is formed from power paddle 23, ground paddle 37, and a dielectric element 57. In accordance with a preferred embodiment of the present invention, power paddle 23 is raised in relation to the leads of the device to accommodate the dielectric element. It may also be desirable to raise ground paddle 37 a small amount to avoid contact with the active die surface.

It may also be desirable to include an electrically insulating, adhesive underfill material 58 between decoupling capacitor 55 and die 38 in order to increase mechanical strength to the device. Underfill material 58 can also be used as a device encapsulant to encapsulate the die and inner portions of the leads as illustrated in FIG. 8. Suitable underfill materials include electrically insulating epoxies, polyimides, and thermoplastic materials. It is also advantageous to chose an underfill material which has a low dielectric constant and a low coefficient of thermal expansion and which is effective in dissipating heat. A thermally conductive underfill material will conduct heat to ground paddle 37, which in turn can remove heat from device 10 through ground leads 36, illustrated in FIG. 10. Various properties of an underfill material can be tailored by the incorporation of fillers, such as silica particles, alumina particles, and the like.

Dielectric element 57 illustrated in FIGS. 8-10 may take numerous forms. Dielectric element 57 may be an insulating polymer material in either sheet or paste form, or may be a ceramic, or a pre-formed capacitor. For instance, a ceramic filled polymer which is cast and cured during manufacture of the leadframe may be used as dielectric element 57. The polymer material could also serve to bond the two leadframes of the device together. Alternatively, dielectric element 57 may be a pre-formed ceramic dielectric or capacitor element (single layer or multilayer) which is electrically coupled to the power and ground paddles. A pre-formed dielectric or capacitor element could be bonded to one voltage paddle of a leadframe, prior to superimposing and bonding the leadframe with another. Furthermore, diffused silicon could be used as a dielectric element. A dielectric element in accordance with the present invention could be conductively bonded to one or both the voltage paddles using, for example, a conductive epoxy, solder, or the like. Other dielectric elements not specifically described herein may also be used in accordance with the present invention to form a decoupling capacitor.

FIG. 9 illustrates a cross-section through power leads 19 of device 10 taken along the line 9—9 of FIG. 5, as the leads would be bonded to semiconductor die 38. As illustrated, power paddle 23 is contiguous with power leads 19 and is raised above the plane of the leads to accommodate dielectric element 57. A raised power paddle such as that illustrated may be formed by a stamping operation during the manufacture of leadframe 12. Ground paddle 37 is also illustrated as overlying the semiconductor die in accordance with the present invention. As mentioned above, an advantage in utilizing a decoupling capacitor in close proximity to the die, apart from electrical performance advantages, is that the large voltage paddle areas provide effective thermal dissipation away from die 38, particularly if a thermally conductive underfill material is used. It is important to note that while device 10 includes a ground paddle which is closest to the die and an overlying power paddle, the present invention may also be practiced by having a power paddle closest to the die and an overlying ground paddle.

A cross-section through ground leads 36 of device 10 taken along the line 10—10 of FIG. 5 is illustrated in FIG. 10. As illustrated, ILB portions 46 of ground leads 36 are shaped to resemble conventional leads or traces, such as signal leads 16 and power leads 19. Central portions 44 of the ground leads, however, are much thicker, allowing the entire central portion of the ground leads to be in full physical and electrical contact with annular ground plane 34. ILB portions 46 of the ground leads extend to form ground paddle 37 which overlies semiconductor die 38 in accordance with the present invention to form decoupling capacitor 55.

As indicated previously, a ground lead shape and an annular ground plane such as that illustrated in FIG. 9 is not necessary in practicing the invention. Instead, ground leads 36 may take on a conventional shape, such as that of signal leads 16 and power leads 19, without utilizing an annular ground. Electrical requirements of the device may be such that the capacitance provided by decoupling capacitor 55 overlying die 38 is large enough to counter rapid changes in voltage while establishing an acceptable level of inductance. Therefore, annular ground plane 34 may not be needed if cross-talk and radiated noise goals can be met.

Figure 11:
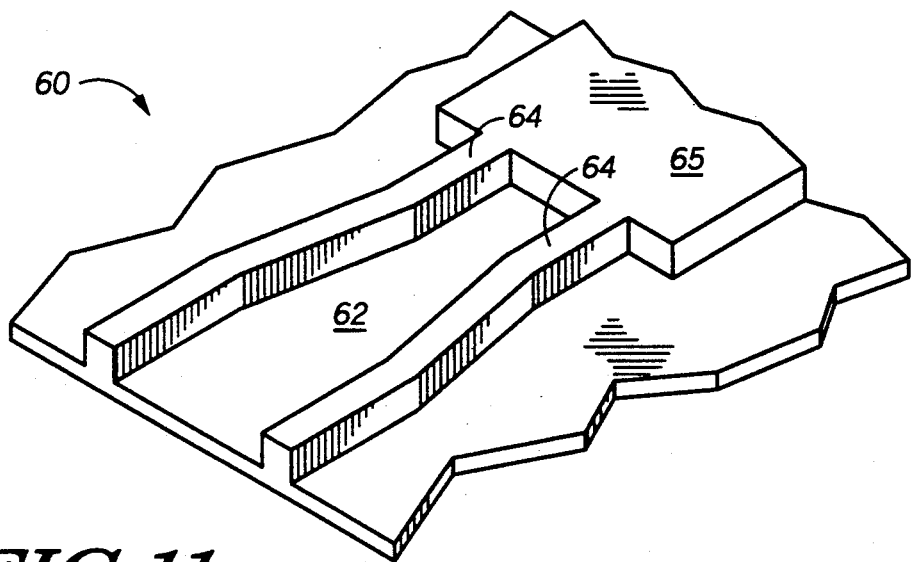
FIGS. 11-16 are perspective views illustrating one method for forming a leadframe for a semiconductor device in accordance with the present invention.

As mentioned above, one embodiment of the present invention includes a leadframe in which voltage leads, preferably ground leads, are embossed on a surface of an annular voltage plane. One method which can be used to make such a TAB leadframe is illustrated in FIGS. 11-16. Each of these figures has been simplified to include only a portion 60 of a TAB leadframe. Portion 60 includes a thin metal region 62, thick metal region 65 and metal strips 64. The cross-sectional thickness of metal strips 64 are initially equal in thickness to thick metal region 65. Preferably each of the elements illustrated in FIG. 11 is formed of copper or a copper-plated material. Raised strips 64 will eventually form two voltage leads, thin metal region 62 will eventually form an annular voltage plane, and thick metal region 65 will eventually form a voltage paddle, as will become apparent in FIGS. 14 and 15.

The structure illustrated in FIG. 11 can be formed in a variety of ways. One method is to provide a relatively thick metal foil and perform a stamping operation which compresses the foil to form thin metal region 62 while leaving raised strips 64 and thick metal region 65. An alternative method is to provide a relatively thick metal foil, mask those portions of the foil which are to remain thick, and etch unmasked portions of the foil until reaching a desired thickness for thin metal region 62. Yet another approach is to form strips 64 and thick metal region 65 using a selective deposition process, whereby material is deposited on select portions of thin metal region 62 until a desired thickness is achieved.

Figure 12:
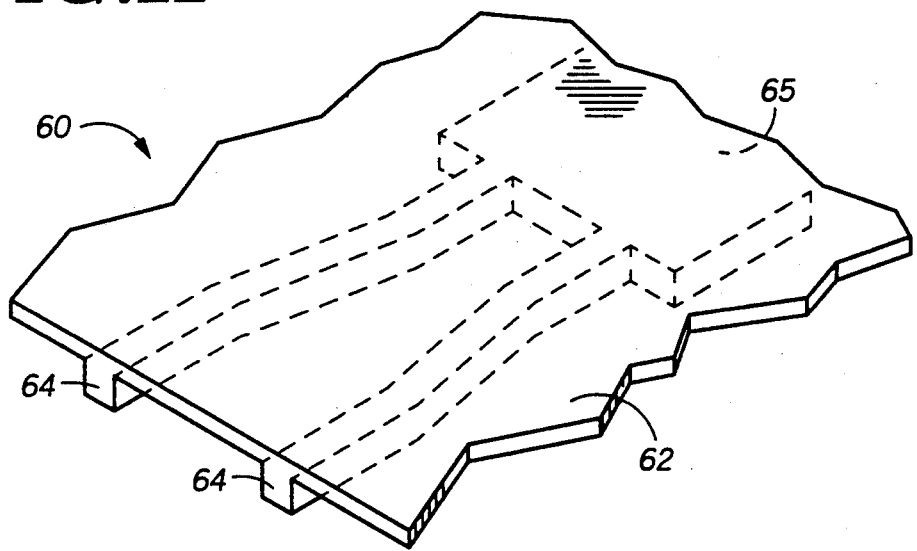
Figure 13:
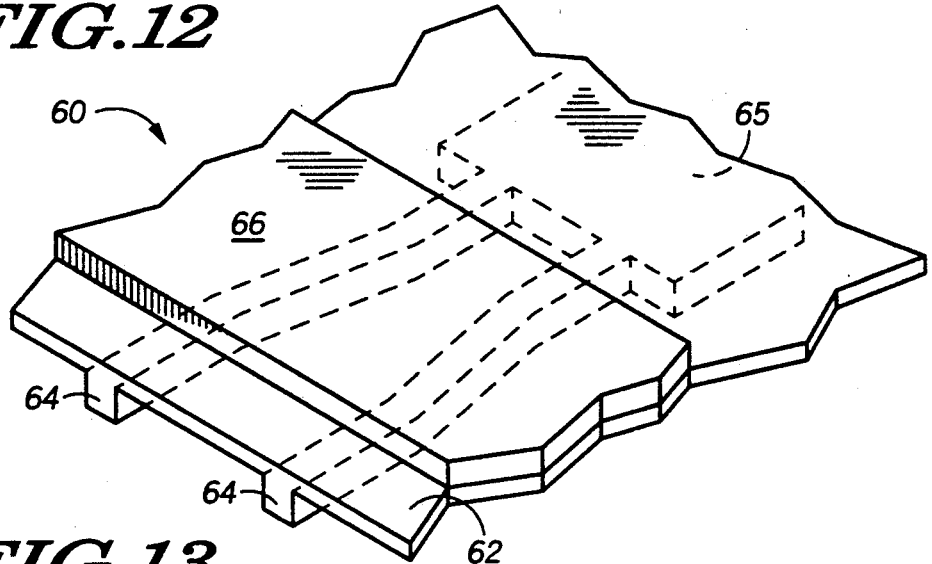
Figure 14:
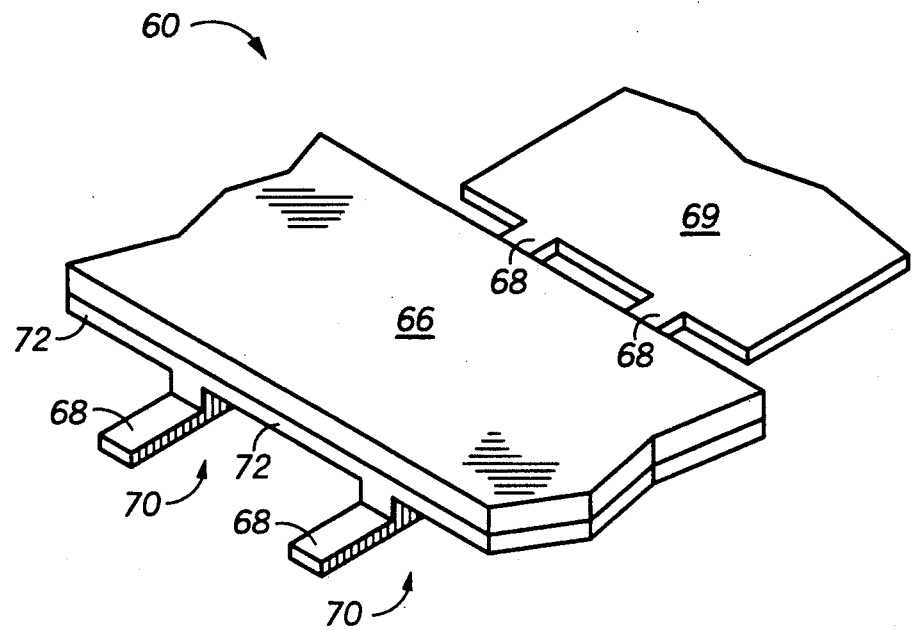
Figure 15:
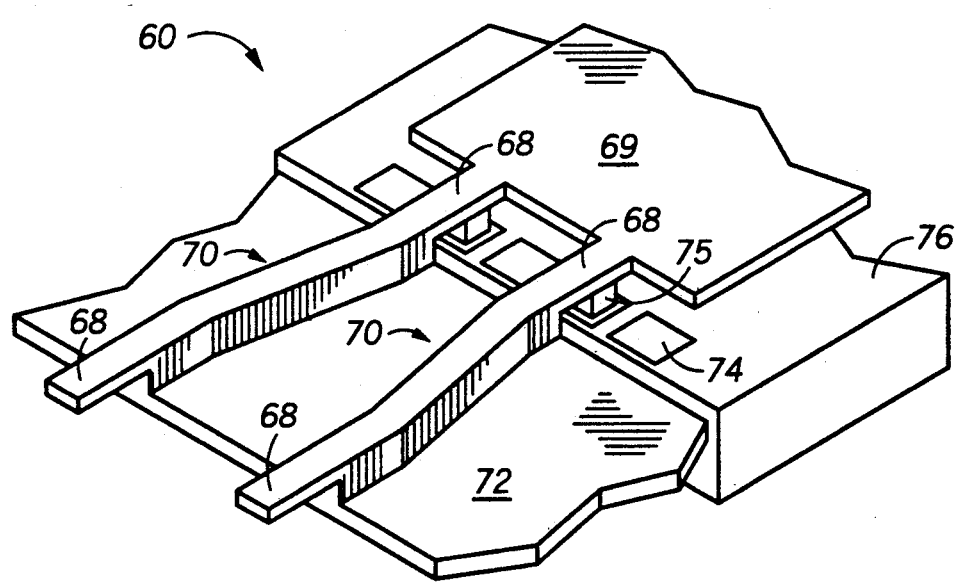

After forming a structure similar to that illustrated in FIG. 11, the leadframe is turned over, as illustrated in FIG. 12. A masking layer 66 is then formed on the planar surface of the leadframe portion. Masking layer 66, illustrated in FIG. 13, is formed on selected portions of the leadframe. More specifically, masking layer 66 protects those portions of the leadframe which will be used as an annular voltage plane. Materials which are suited for use as masking layer 66 include those which are commonly used in TAB tape and leadframe manufacturing, for example photoresist materials. Conventional lithography techniques are used to pattern the masking layer into the appropriate shape. After the masking layer is formed, leadframe portion 60 is etched to remove unmasked portions of thin metal region 62 and partially remove unmasked portions of strips 64 and thick metal region 65. The etch is terminated at a point in which ledges 68 are formed in strips 64 and thick metal region 65 is reduced in thickness to form a voltage paddle 69, as illustrated in FIG. 14. The ledges, together with the unetched portions of strips 64, form voltage leads 70. Ledges 68 of voltage leads 70 are analogous to the ILB and OLB portions of ground leads 36 of FIG. 4. The masked portion of the thin metal region 62 which does not get etched forms an annular voltage plane 72 which is contiguous with voltage leads 70. After the voltage leads, voltage paddle, and voltage plane have been formed, masking layer 66 is removed. The resulting structure, as it may appear electrically coupled to bond pads 74 of a semiconductor die 76, by conductive bumps 75, is illustrated in FIG. 15.

Figure 16:
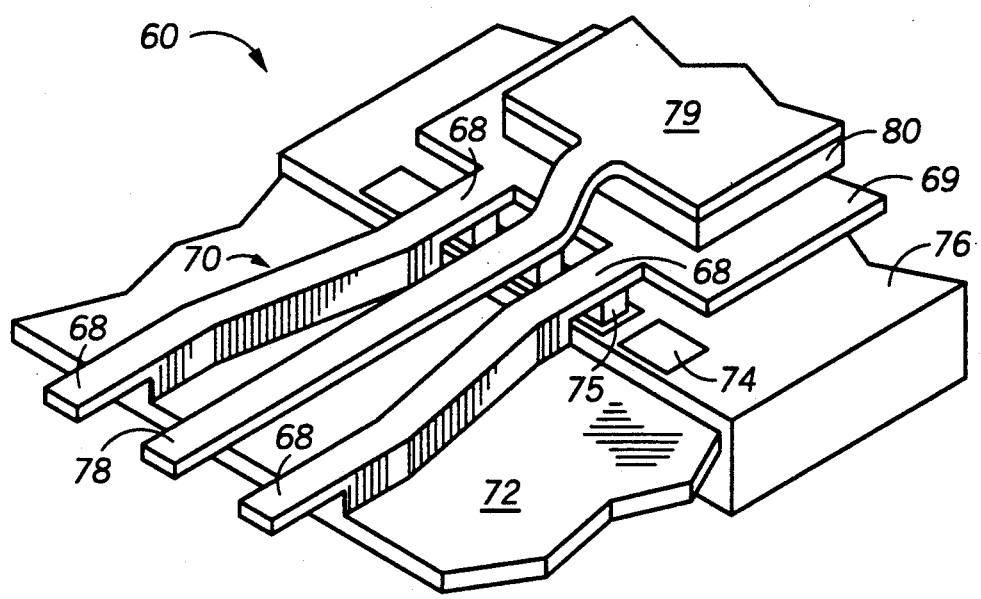

In accordance with the present invention, an additional leadframe is also included in a semiconductor device, as illustrated in FIG. 16. The additional leadframe (only a portion of which is illustrated) includes a voltage paddle 79 and one or more voltage leads 78. The voltage paddles 69 and 79, along with a dielectric element 80 form a decoupling capacitor overlying the active surface of die 76. It is important to point out that while FIGS. 15 and 16 indicate that the two leadframes are electrically coupled to a semiconductor die individually, this is not required in practicing the invention. Two leadframes may first be superimposed and bonded with one another prior to electrically coupling the leadframes to a die.

Alternative processing steps may be used to form a voltage plane and voltage leads in accordance with the present invention. For instance, stamping operations, rather than etching steps, can be used to form the voltage plane and voltage leads. A combination of various stamping and etching steps may also be used. As an example, thin metal region 62 could be etched to form an annular voltage plane 72 while metal strips 64 could be stamped to form ledges 68. A leadframe in accordance with the present invention could also be formed using entirely subtractive etching procedures, or other processes known in leadframe manufacturing.

The present invention has several advantages over existing semiconductor devices which utilize decoupling capacitors. One advantage, is that a decoupling capacitor in a device in accordance with the present invention is very close to a semiconductor die. Thus, inductance which is associated with interconnection between the die and the decoupling capacitor is minimized. Another important advantage of the present invention is that all power leads of the device are electrically coupled to the power plane and all ground leads of the device are directly electrically coupled to the ground plane(s) of the device. As a result of this physical and electrical continuity between the power leads and the power plane and between the ground leads and ground plane, voltage drops during device operation are less likely to occur than in existing semiconductor devices. Most existing devices do not utilize a decoupling capacitor which is electrically coupled to all power supply bond pads of a die as in the present invention. Furthermore, existing devices have higher inductance associated with lengthy interconnections whereas interconnection in the present invention is minimized.

Thus it is apparent that there has been provided, in accordance with the invention, a TAB semiconductor device having an integral decoupling capacitor and a method for making the same that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, aspects of the present invention can be extended to devices and leadframes other than TAB. Multilayer or multilevel metal leadframes used in molded plastic packages may incorporate concepts disclosed herein, such as the use of ground leads which are embossed on a ground plane and the idea of superimposing two leadframes to form a decoupling capacitor which directly overlies a semiconductor die. In using such metal leadframes, wire bonding techniques rather than TAB techniques may be employed. In addition, the present invention is not limited to utilizing a ground plane which is closest to a semiconductor die. Instead, an uppermost voltage plane may be the ground plane while the lowermost voltage plane may be a power plane. Furthermore, one or both voltage paddles or planes may be segmented to permit decoupling between two or more voltages. For example, power paddle 23 of FIG. 5 could be split into two segments, one for a voltage of 3.3

V and the other for a voltage of 2 V. Similarly, the ground paddle could be split into two or more ground segments to permit independent decoupling of input and output circuitry. In addition, the present invention is not limited to forming embossed ground leads on an annular ground plane. Rather, embossed power leads may be formed on an annular power plane in accordance with an embodiment of the present invention. Furthermore, use of an annular voltage plane may be eliminated altogether under conditions described previously. It is also important to note that the present invention is not limited in any way to those materials specifically described. Moreover, the dimensions listed are merely representative and in no way restrict the invention.

Due to the rapid change in semiconductor manufacturing technology, it is envisioned that new materials and new manufacturing techniques will allow for many improvements to the present invention. It is, therefore, intended that this invention encompass all such variations and modifications as fall within the scope of the appended claims.

I claim:

1. A semiconductor device comprising:
   a semiconductor die having a plurality of first voltage bond pads and a plurality of second voltage bond pads;
   a first leadframe having a first voltage plane and a plurality of first voltage leads which are contiguous with the first voltage plane, the first voltage leads being electrically coupled to the plurality of first voltage bond pads of the semiconductor die;
   a second leadframe having a second voltage plane and a plurality of second voltage leads which are contiguous with the second voltage plane, the second voltage leads being electrically coupled to the second voltage bond pads of the semiconductor die, the second leadframe being superimposed with the first leadframe such that second voltage plane overlies the first voltage plane, such that both the first and second voltage planes overlie the semiconductor die, and such that the first and second leadframes are electrically isolated from one another; and
   a dielectric element separating the first and second voltage planes to form a decoupling capacitor over the semiconductor die.

2. The semiconductor device of claim 1 wherein the first and second leadframes are both TAB (tape automated bonding) leadframes.

3. The semiconductor device of claim 1 wherein the second voltage plane is raised in comparison to the second voltage leads.

4. The semiconductor device of claim 1 wherein portions of the first voltage leads and portions of the second voltage leads lie substantially in a common plane within the device.

5. The semiconductor device of claim 1 wherein the dielectric element is an element selected from a group consisting of polymers, ceramics, ceramic-filled polymers, pre-formed dielectrics, and pre-formed capacitors.

6. The semiconductor device of claim 1 wherein the first voltage plane is a ground plane, the plurality of first voltage leads are ground leads, the second voltage plane is a power plane, and the plurality of second voltage leads are power leads.

7. A semiconductor device comprising:
   a semiconductor die having a plurality of ground bond pads, and a plurality of power bond pads;
   a first leadframe having an annular ground plane formed of a continuous conductive film and a plurality of ground leads embossed on a surface of the ground plane such that the ground plane and ground leads form a monolithic structure, each ground lead having an inner lead portion located within the annular ground plane and electrically coupled to one of the ground bond pads of the semiconductor die, the first leadframe also having a ground paddle positioned within the annular ground plane and joined to the inner lead portions of the ground leads;
   a second leadframe having a plurality of power leads each having an inner lead portion electrically coupled to one of the plurality of power bond pads of the semiconductor die, the second leadframe also having a power paddle joined to the inner lead portions of the power leads, the second leadframe being superimposed with the first leadframe such that the power paddle overlies the ground paddle and such that both the power and ground paddle overlie the semiconductor die; and
   a dielectric separating the ground paddle and power paddle to form a decoupling capacitor.

8. The semiconductor device of claim 7 wherein the first and second leadframes are both TAB (tape automated bonding) leadframes.

9. The semiconductor device of claim 7 wherein the power paddle of the second leadframe is raised with respect to the plurality of power leads.

10. The semiconductor device of claim 7 wherein the inner lead portion of each ground lead is substantially thinner the remaining portions of each ground lead.

11. The semiconductor device of claim 7 wherein the ground paddle has a predetermined thickness and wherein the inner lead portions of the plurality of ground leads each have a thickness which is substantially equal to the predetermined thickness.

12. The semiconductor device of claim 7 wherein the inner lead portions of the ground leads lie substantially in a common plane with the inner lead portions of the power leads.

13. A method of fabricating a semiconductor device, comprising the steps of:
   providing a semiconductor die having a plurality of first voltage bond pads and a plurality of second voltage bond pads;
   providing a first leadframe having a first voltage plane formed of a conductive film and a plurality of first voltage leads which are contiguous with the first voltage plane, each first voltage lead having an inner lead portion;
   providing a second leadframe having a second voltage plane and a plurality of second voltage leads which are contiguous with the second voltage plane, each second voltage lead having an inner lead portion;
   placing a dielectric element on one of either the first voltage plane or the second voltage plane;
   superimposing the first and second leadframes such the first voltage leads are interspersed with the second voltage leads, such that the second voltage plane overlies the dielectric element and the first voltage plane to form a decoupling capacitor, and such that inner lead portions of the first voltage leads and inner lead portions of the second voltage leads lie substantially in a common plane;

electrically coupling the inner lead portions of the first voltage leads to the first voltage bond pads of the semiconductor die; and electrically coupling the inner lead portions of the second voltage leads to the second voltage bond pads of the semiconductor die.

14. The method of claim 13 wherein the steps of providing first and second leadframes comprises providing a first TAB (tape automated bonding) leadframe and providing a second TAB leadframe, respectively.

15. The method of claim 13 wherein the step of placing a dielectric element comprises placing a dielectric element selected from a group consisting of polymers, ceramics, ceramic-filled polymers, pre-formed dielectrics, and pre-formed capacitors.

16. The method of claim 13 wherein the step of providing a first leadframe having a first voltage plane formed of a conductive film and a plurality of first voltage leads comprises providing a first leadframe having a ground plane and a plurality of ground leads, and wherein the step of providing a second leadframe having a second voltage plane and a plurality of second voltage leads comprises providing a second leadframe having a power plane and a plurality of power leads.

17. The method of claim 16 wherein the step of providing a first leadframe comprises providing a first leadframe having an annular ground plane formed of a conductive film and a plurality of ground leads embossed on a surface thereof, each embossed ground lead having an inner lead portion which is contiguous with a ground paddle located within the annular ground plane.

* * * * *